United States Patent
Quick et al.

(10) Patent No.: US 7,419,887 B1
(45) Date of Patent: Sep. 2, 2008

(54) LASER ASSISTED NANO DEPOSITION

(76) Inventors: Nathaniel R. Quick, 894 Silverado Ct., Lake Mary, FL (US) 32746; Aravinda Kar, 745 S. Lake Claire Cir., Oviedo, FL (US) 32765

( * ) Notice: Subject to any disclaimer, the term of this patent is extended or adjusted under 35 U.S.C. 154(b) by 294 days.

(21) Appl. No.: 11/189,266

(22) Filed: Jul. 26, 2005

Related U.S. Application Data

(60) Provisional application No. 60/592,925, filed on Jul. 26, 2004.

(51) Int. Cl.
*H01L 21/20* (2006.01)
*H01L 21/36* (2006.01)

(52) U.S. Cl. .................. 438/479; 438/478; 438/485; 438/487; 438/535; 257/E23.095; 977/700; 977/712; 977/773; 977/786

(58) Field of Classification Search .............. 438/479
See application file for complete search history.

(56) References Cited

U.S. PATENT DOCUMENTS

| | | | |
|---|---|---|---|
| 3,214,315 A | 10/1965 | Hildebrand |
| 3,396,401 A | 8/1968 | Nonomura |
| 3,419,321 A | 12/1968 | Barber et al. |
| 3,605,469 A | 9/1971 | Queralto |
| 3,788,120 A | 1/1974 | Takeo et al. |
| 3,854,123 A | 12/1974 | Banach |
| 3,865,564 A | 2/1975 | Jaeger et al. |
| 3,874,240 A | 4/1975 | Rembaum |
| 3,943,324 A | 3/1976 | Haggerty |
| 3,944,640 A | 3/1976 | Haggerty et al. |
| 3,945,318 A | 3/1976 | Landsman |
| 3,965,328 A | 6/1976 | Locke |
| 3,981,705 A | 9/1976 | Jaeger et al. |
| 4,043,170 A | 8/1977 | Erodi et al. |
| 4,135,902 A | 1/1979 | Oehrle |
| 4,142,088 A | 2/1979 | Hirsch |
| 4,159,414 A | 6/1979 | Suh et al. |
| 4,215,263 A | 7/1980 | Grey et al. |
| 4,309,224 A | 1/1982 | Shibata |
| 4,339,285 A | 7/1982 | Pankove |
| 4,372,989 A | 2/1983 | Menzel |
| 4,383,843 A | 5/1983 | Iyengar |
| 4,496,607 A | 1/1985 | Mathias |

(Continued)

OTHER PUBLICATIONS

K. G. Kreider, D.R.F. Burgess, Jr., M.J.Tarlov, G. Gillen and W. Wight, R. Lareau and L. M. Casas, "Laser Transformed SiC Thin Films," Materials Research Symposium Proceeding, vol. 339.

(Continued)

*Primary Examiner*—Walter Lindsay, Jr.
*Assistant Examiner*—Abdulfattah Mustapha
(74) *Attorney, Agent, or Firm*—Frijouf, Rust & Pyle, P.A.

(57) ABSTRACT

An apparatus and method is disclosed for forming a nano structure on a substrate with nano particles. The nano particles are deposited through a nano size pore onto the substrate. A laser beam is directed through a concentrator to focus a nano size laser beam onto the deposited nano particles on the substrate. The apparatus and method is suitable for fabricating patterned conductors, semiconductors and insulators on semiconductor wafers of a nano scale line width by direct nanoscale deposition of materials.

10 Claims, 4 Drawing Sheets

U.S. PATENT DOCUMENTS

| | | | |
|---|---|---|---|
| 4,539,251 | A | 9/1985 | Sugisawa et al. |
| 4,547,650 | A | 10/1985 | Arditty et al. |
| 4,565,712 | A | 1/1986 | Noguchi et al. |
| 4,620,264 | A | 10/1986 | Ushifusa et al. |
| 4,624,934 | A | 11/1986 | Kokubu et al. |
| 4,663,826 | A | 5/1987 | Bauerle |
| 4,691,091 | A | 9/1987 | Lyons et al. |
| 4,710,253 | A | 12/1987 | Soszek |
| 4,761,339 | A | 8/1988 | Komatsu et al. |
| 4,791,239 | A | 12/1988 | Sirahata et al. |
| 4,840,853 | A | 6/1989 | Iio et al. |
| 4,847,138 | A | 7/1989 | Boylan et al. |
| 4,860,442 | A | 8/1989 | Ainsworth et al. |
| 4,872,923 | A | 10/1989 | Borodin |
| 4,880,770 | A | 11/1989 | Mir et al. |
| 4,901,550 | A | 2/1990 | Koide |
| 4,912,087 | A | 3/1990 | Aslam et al. |
| 4,924,033 | A | 5/1990 | Iyogi et al. |
| 4,950,558 | A | 8/1990 | Sarin |
| 4,962,085 | A | 10/1990 | deBarbadillo, II et al. |
| 4,988,564 | A | 1/1991 | D'Angelo et al. |
| 5,015,618 | A | 5/1991 | Levinson |
| 5,055,967 | A | 10/1991 | Sukonnik et al. |
| 5,127,364 | A | 7/1992 | Savkar et al. |
| 5,145,741 | A | 9/1992 | Quick |
| 5,149,681 | A | 9/1992 | Ohkawa et al. |
| 5,180,440 | A | 1/1993 | Siegel et al. |
| 5,336,360 | A | 8/1994 | Nordine |
| 5,391,841 | A | 2/1995 | Quick |
| 5,405,481 | A | 4/1995 | Licoppe et al. |
| 5,459,098 | A | 10/1995 | Maya |
| 5,493,096 | A | 2/1996 | Koh |
| 5,549,971 | A | 8/1996 | Nordine |
| 5,629,532 | A | 5/1997 | Myrick |
| 5,680,200 | A | 10/1997 | Sugaya et al. |
| 5,695,828 | A | 12/1997 | Ghosh et al. |
| 5,733,609 | A | 3/1998 | Wang |
| 5,754,299 | A | 5/1998 | Sugaya et al. |
| 5,793,042 | A | 8/1998 | Quick |
| 5,823,039 | A | 10/1998 | Umeda et al. |
| 5,837,607 | A | 11/1998 | Quick |
| 5,847,418 | A | 12/1998 | Nakamura et al. |
| 5,889,234 | A | 3/1999 | Ghosh et al. |
| 5,906,708 | A | 5/1999 | Robinson et al. |
| 5,961,877 | A | 10/1999 | Robinson et al. |
| 6,025,609 | A | 2/2000 | Quick |
| 6,054,375 | A | 4/2000 | Quick |
| 6,064,081 | A | 5/2000 | Robinson et al. |
| 6,093,610 | A * | 7/2000 | Rodder ............... 438/289 |
| 6,203,861 | B1 | 3/2001 | Kar et al. |
| 6,221,154 | B1 | 4/2001 | Lee et al. |
| 6,252,197 | B1 | 6/2001 | Hoekstra et al. |
| 6,255,671 | B1 | 7/2001 | Bojarczuk et al. |
| 6,271,576 | B1 | 8/2001 | Quick |
| 6,274,234 | B1 | 8/2001 | Dujardin et al. |
| 6,313,015 | B1 | 11/2001 | Lee et al. |
| 6,334,939 | B1 | 1/2002 | Zhou et al. |
| 6,407,443 | B2 * | 6/2002 | Chen et al. ............ 257/616 |
| 6,526,327 | B2 | 2/2003 | Kar et al. |
| 6,621,448 | B1 | 9/2003 | Lasky et al. |
| 6,670,693 | B1 | 12/2003 | Quick |
| 6,732,562 | B2 | 5/2004 | Quick et al. |
| 6,930,009 | B1 | 8/2005 | Quick |
| 6,939,748 | B1 | 9/2005 | Quick |
| 2003/0075531 | A1 * | 4/2003 | Kupisiewicz ......... 219/121.69 |
| 2005/0233474 | A1 * | 10/2005 | Roitman et al. ........... 436/525 |

OTHER PUBLICATIONS

D.K. Sengupta, N. R. Quick and A. Kar, "Laser Direct Write of Conducting and Insulating Tracks in Silicone Carbide," Materials Research Society Symposium Proceedings, vol. 624.

D.K. Sengupta, N. R. Quick and A. Kar, "Laser Synthesis of Ohmic Contacts in Silicone Carbide Having Schottky Diode Characteristics Before Laser Treatment".

D.K. Sengupta, N. R. Quick and A. Kar, "Laser Conversion of Electrical Properties for Silicon Carbide Device Applications," Journal of Laser Applications, p. 26, vol. 13, No. 1, Feb. 2001.

Nathaniel R. Quick, "Laser Synthesis of Conductive Phases in Silicone Carbide and Aluminum Nitride," The Minerals, Metals & Materials Society, 1995.

* cited by examiner

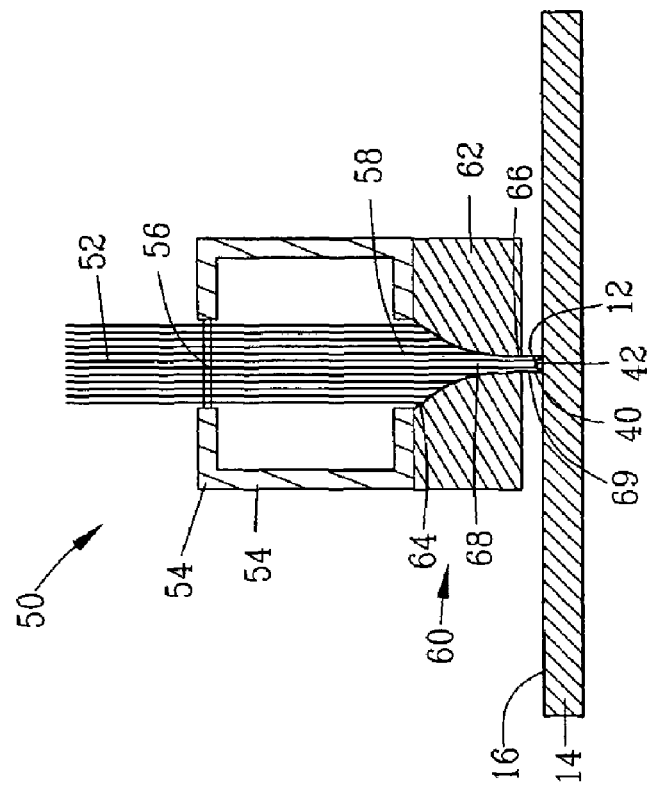
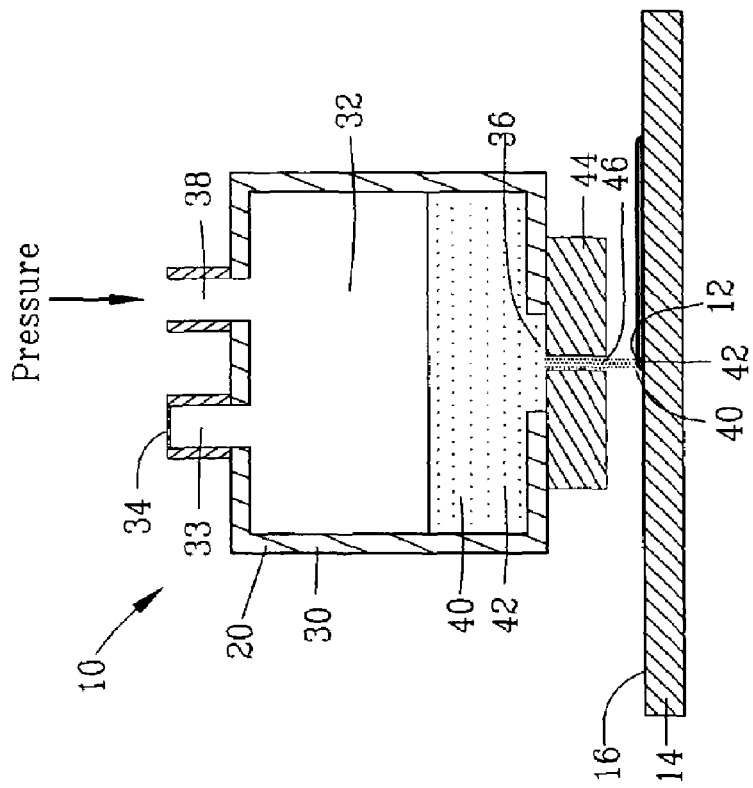

LASER ASSISTED NANO DEPOSITION

CROSS-REFERENCE TO RELATED APPLICATIONS

This application claims benefit of U.S. Patent Provisional application Ser. No. 60/592,925 filed Jul. 26, 2004. All subject matter set forth in provisional application Ser. No. 60/592,925 is hereby incorporated by reference into the present application as if fully set forth herein.

BACKGROUND OF THE INVENTION

1. Field of the Invention

This invention relates to nano-technology and more particularly to the process of nano manufacturing through the use of a nano size dispenser and a nano size laser beam.

2. Background of the Invention

It has been recognized widely that nanotechnology will lead to the era of nanoelectronics enhancing the performance of current microelectronics. Nanolithography and nanoscale device fabrication are important steps for this advance in nano manufacturing. Over the past several years, numerous nanolithography techniques have been investigated, e.g., deep ultraviolet (DUV), extreme ultraviolet (EUV), X-rays, tip of an atomic microscope (AFM), tip of a near-field scanning optical microscope (NSOM), micro-contact printing, evanescent near-field optical lithography (ENFOL) and evanescent interferometric lithography (EIL). Both ENFOL and EIL techniques create an evanescent optical field directly below the contact mask with the promise of $\lambda/20$ resolution, where $\lambda$ is the laser wavelength. Other nanolithography techniques include dip-pen patterning, embossing, self-assembly, electron beam as well as focused ion beam direct-writing and immersion interferometric nanolithography. Only a few of these techniques are being considered for nanomanufacturing. The acceptance of a given technique as a nanomanufacturing tool in the semiconductor industry is largely determined by its cost-effectiveness. Therefore there is a progressive need for developing cheaper and more efficient tools. Often new tools with novel capability allow rapid prototyping as well as fabrication of new products. The following patents represent some of the contribution in the art in nano technology.

U.S. Pat. No. 5,405,481 to Licoppe, et al. discloses a gas photonanograph for the production and optical analysis of nanometer scale patterns. The photonanograph has a gas expansion chamber equipped with a gas supply for producing patterns and provided at a first end with microcapillaries for the discharge of the gas, an optical fibre, which is sharp at a first end and which is to be positioned facing the sample to be treated, a light source coupled to the second end of the optical fiber, the latter being transparent to the light emitted by the light source, and detecting and processing apparatus for monitoring a light signal reflected by the sample. The photonanograph permits the localized etching or deposition of materials for microelectronics or microoptoelectronics.

U.S. Pat. No. 5,680,200 to Sugaya et. al. relates to inspection apparatus and method in which, based on images under a plurality of focus conditions formed by way of an optical system to be inspected, namely, using images under a plurality of defocal conditions, tendency in positional change or change of asymmetry between the images is calculated so as to specify at least one of aberration condition and optical adjustment condition of the optical system to be inspected as well as to exposure apparatuses and overlay accuracy measurement apparatuses provided with the inspection apparatus. In addition, the present invention relates to an image-forming optical system suitable to an alignment apparatus which is applicable to the exposure apparatuses. This image-forming optical system comprises a correction optical system for intentionally generating asymmetric aberration or symmetric aberration in the image-forming optical system and a decentering mechanism for decentering the correction optical system to cancel asymmetric aberration or symmetric aberration in the image-forming optical system.

U.S. Pat. No. 5,754,299 to Sugaya et. al. relates to inspection apparatus and method in which, based on images under a plurality of focus conditions formed by way of an optical system to be inspected, namely, using images under a plurality of defocal conditions, tendency in positional change or change of asymmetry between the images is calculated so as to specify at least one of aberration condition and optical adjustment condition of the optical system to be inspected as well as to exposure apparatuses and overlay accuracy measurement apparatuses provided with the inspection apparatus. In addition, the present invention relates to an image-forming optical system suitable to an alignment apparatus which is applicable to the exposure apparatuses. This image-forming optical system comprises a correction optical system for intentionally generating asymmetric aberration or symmetric aberration in the image-forming optical system and a decentering mechanism for decentering the correction optical system to cancel asymmetric aberration or symmetric aberration in the image-forming optical system.

U.S. Pat. No. 6,203,861 to Aravinda Kar et al. discloses a one-step rapid manufacturing process used to create three dimensional prototyping parts. Material such as metal, ceramics and the like powder, and wire, and the like, is delivered to a laser beam-material interaction region where it is melted and deposited on a substrate. The melted and deposited material is placed on a XYZ workstation. Three dimensional parts are created by moving the XYZ workstation relative to the laser beam while simultaneously feeding powdered alloys, first in the XY and then in the Z plane. Beam shaping focusing optics can be used to tailor the intensity distribution of the laser beam to the requirements of the deposition layers, and can be used to create parts with desired mechanical or thermodynamic properties. Additional beam splitting and recombining optics can be used to allow powder to be fed at a perpendicular angle to the substrate.

U.S. Pat. No. 6,526,327 to Aravinda Kar et al. discloses a one-step rapid manufacturing process used to create three dimensional prototyping parts. Material such as metal, ceramics and the like powder, and wire, and the like, is delivered to a laser beam-material interaction region where it is melted and deposited on a substrate. The melted and deposited material is placed on a XYZ workstation. Three dimensional parts are created by moving the XYZ workstation relative to the laser beam while simultaneously feeding powdered alloys, first in the XY and then in the Z plane. Beam shaping focusing optics can be used to tailor the intensity distribution of the laser beam to the requirements of the deposition layers, and can be used to create parts with desired mechanical or thermodynamic properties. Additional beam splitting and recombining optics can be used to allow powder to be fed at a perpendicular angle to the substrate.

U.S. Pat. No. 6,621,448 to Lasky et al. discloses a system and method for imaging objects obscured by a covering layer of snow. The system preferably utilizes a continuous-wave radar generating short-wavelength radio-frequency (RF) signal beam-scanned over angular displacements following a scanning pattern toward a target area. Reflections of the RF signal from objects buried beneath the snow are registered by an array of RF detectors whose signal magnitudes are summed arid correlated with scan direction to generate a signal providing spatial object information, which by way of example, is visually displayed. The radio-frequency beam may be scanned over the scene electronically or by either mechanically or electromechanically modulating antenna direction or the orientation of a beam deflector. The system is capable of generating multiple image frames per second, high-resolution imaging, registration of objects to a depth exceeding two meters, and can be implemented at low cost without complex signal processing hardware.

Therefore, it is an object of the present invention is to advance the art by providing an apparatus and a method for forming a nano structure on a substrate.

Another object of this invention is to provide an apparatus and a method for forming a nano structure such as electrical conductors on a semiconductor substrate.

Another object of this invention is to provide an improved apparatus and a method for forming a nano structure incorporating a nano particle dispenser for depositing the nano particles onto a substrate.

Another object of this invention is to provide an improved apparatus and a method for forming a nano structure incorporating a nano size laser beam for impinging upon the deposited nano particles on the substrate.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention and the detailed description describing the preferred embodiment of the invention.

SUMMARY OF THE INVENTION

A specific embodiment of the present invention is shown in the attached drawings. For the purpose of summarizing the invention, the invention relates to an improved apparatus for forming a nano structure on a substrate with nano particles suspended in a suspension fluid. The apparatus comprises a container for containing the nano particles suspended in the suspension fluid. A nano size pore communicates with the container. A pressure source forces the nano particles suspended in the suspension fluid through the nano size pore for depositing the nano particles onto the substrate. A concentrator focuses a concentrated laser beam is upon the nano particles deposited on the substrate for facilitating a reaction between the nano particles and the substrate.

In a more specific embodiment of the invention, the nano particles are suspended in a suspension fluid and the pressure source forces the nano particles suspended in the suspension fluid through the nano size pore for depositing the nano particles onto the substrate. In another example, the nano particles are suspended in a suspension liquid and the pressure source includes a gas pressure source for forcing the nano particles suspended in the suspension liquid through the nano size pore for depositing the nano particles onto the substrate. The nano size pore communicates with the container with the nano size pore formed, for example, with an electron beam.

The concentrator focuses the laser beam upon the nano particles deposited on the substrate. The laser beam evaporates the suspension fluid and fuses the nano particles to the substrate. The concentrator may include a waveguide and/or a negative refractive index material for focusing a concentrated laser beam onto the nano particles located on the substrate.

The invention is also incorporated into the method of forming a nano structure on a substrate, comprising the steps of depositing nano particles through a nano size pore onto the substrate and directing a laser beam through a concentration to focus a nano size laser beam onto the deposited nano particles on the substrate.

The foregoing has outlined rather broadly the more pertinent and important features of the present invention in order that the detailed description that follows may be better understood so that the present contribution to the art can be more fully appreciated. Additional features of the invention will be described hereinafter which form the subject matter of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention.

BRIEF DESCRIPTION OF THE DRAWINGS

For a fuller understanding of the nature and objects of the invention, reference should be made to the following detailed description taken in connection with the accompanying drawings in which:

FIG. 3 is a side view of FIG. 2;

FIG. 4 is a side sectional view of a laser system directing a laser beam through a nano size laser aperture onto the deposited nano particles on the substrate;

Similar reference characters refer to similar parts throughout the several Figures of the drawings.

DETAILED DISCUSSION

Figure 1:
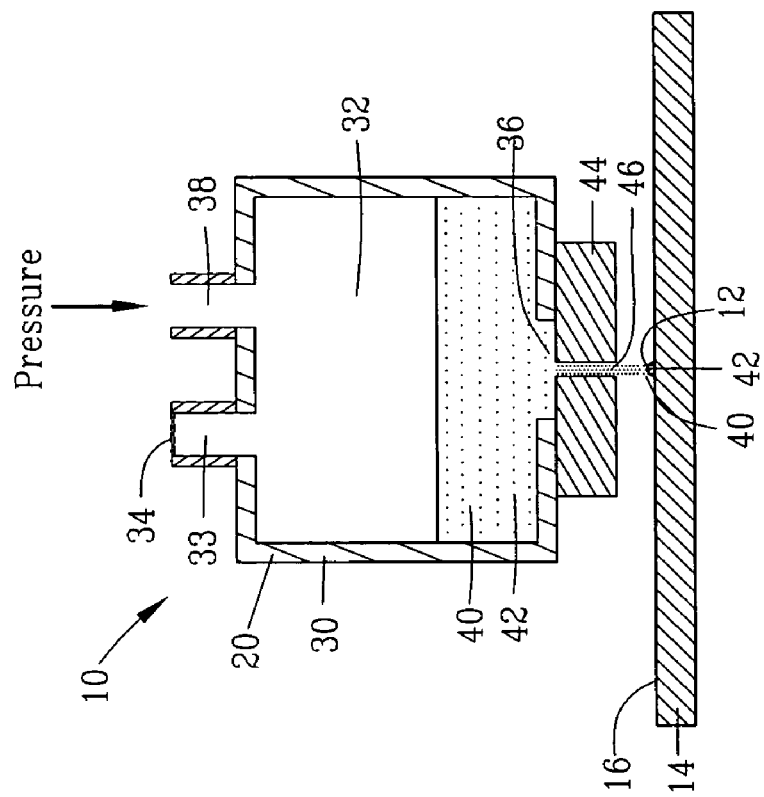
FIG. 1 is a side sectional view of a dispenser being filled with a fluid containing nano particles suspended in the suspension fluid.
Figure 2:
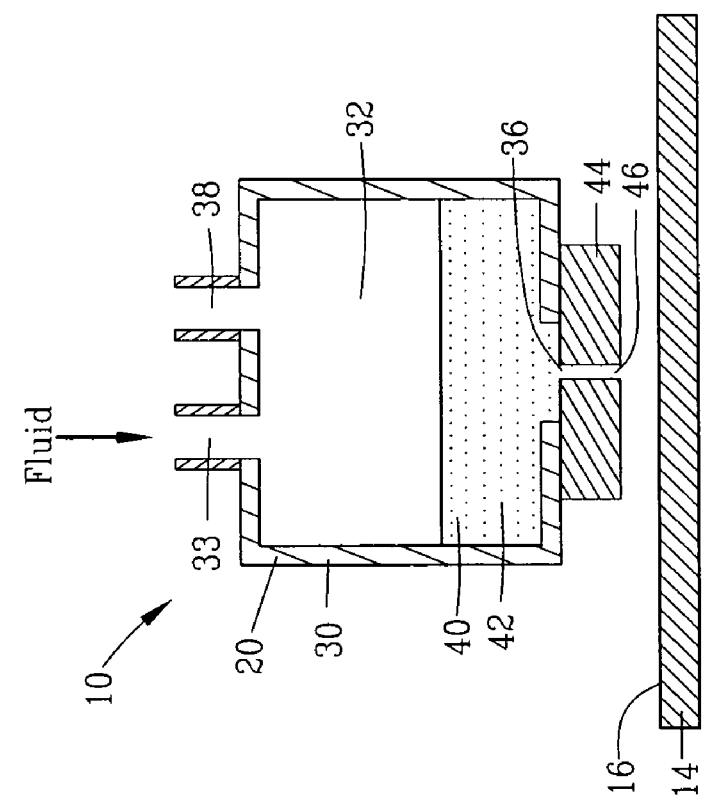
FIG. 2 is a view similar to FIG. 2 illustrating the deposition of the nano particles through a nano size pore onto a substrate.

FIGS. 1-3 are various views of an apparatus 10 for forming a nano structure 12 on a substrate 14. The apparatus 10 comprises a dispenser 20 having a container 30 for containing a suspension fluid 40 having a nano particles 42. The dispenser 20 deposits the suspension fluid 40 and the nano particles 42 onto surface 16 of the substrate 14.

In this example, the substrate 14 is shown as a semiconductor substrate 14 with the apparatus 10 forming a continuous nano pattern 12 on the substrate 14. The dispenser 20 is positioned adjacent to the surface 16 of the substrate 14. The dispenser 20 and/or the substrate 14 are movable relative to each other by conventional means (not shown) for enabling the dispenser 20 to be positioned and/or moved continuously to various locations about the surface 16 of the substrate 14.

FIGS. 4-7 are various views of a laser processor 50 for acting in concert with the dispenser 20 for forming the nano structure 12 onto the surface 16 of the substrate 14. The nano structure 12 are formed on the surface 16 of the substrate 14 in situ without the need for conventional masking techniques.

The container 30 defines a volume 32 having a fluid input 33 having a closure 34. The container 30 includes a fluid output 36 and a pressure input 38. A dispenser head 44 having a nano pore 46 is affixed to the container 30 with the fluid output 36 communicating with the nano pore 46. The dispenser head 44 may be metal or ceramic member.

In the event a nano line of width 30 nm is desired, a nano pore 46 having a 30 nm diameter is formed in the dispenser 44 head. Preferably, the nano pore 46 is formed in the dispenser head 44 with an electron beam. For example, diameter less than 10 nm may be formed by a high quality electron beam system such as a Model No. LEICA 5000. It should be appreciated by those killed in the art that the nano pore 46 may be formed in dispensing head 44 by other suitable means.

FIG. 1 is a side sectional view of the container 30 being filled with the suspension fluid 40 containing the nano particles 42 in a suspension within the suspension fluid 40. The suspension fluid 40 is introduced into the container 30 through the fluid input 33. Preferably, the suspension fluid 40 is a suspension liquid having nano particles 42 suspended within the suspension liquid 40.

The suspension fluid 40 may be a standard liquid solution, a sol-gel or a metal-organic fluid. In the case of a standard solution, the solution is the carrier for the metal or nonmetal nano particles 42. The viscosity of the suspension fluid 40 is controlled for constant rate deposition driven by pressure applied to the pressure input 38.

The suspension liquid 40 may be a liquid suspension of nano particles 42 or a metal-organic compound of a required metal for the nano particles 42. The nano particles 42 in the form of a metal-organic compound may provide a dopant for the semiconductor substrate 14. Preferably, the size of nano particles 42 in the suspension liquid 40 is less than the size of the nano pore 46.

FIG. 2 is a view similar to FIG. 1 illustrating the deposition of the nano particles 42 through the nano pore 46 onto the surface 16 of the substrate 14. The fluid input 33 is closed by the closure 34. A pressure is applied to the pressure input 38 to project the suspension fluid 40 and the nano particles 42 onto the surface 16 of the substrate 14. Preferably, the pressure is applied to the pressure input 38 by a high pressure gas to propel the suspension fluid 40 and the nano particles 42 through the nano pore 46. Each of the nano particles 42 is of a lesser size than the nano pore 46. The suspension fluid 40 and the nano particles 42 is deposited onto the surface 16 of the substrate 14.

FIG. 3 is a side view of FIG. 2 illustrating the formation of a longitudinally extending nano structure 12. A relative movement between the dispenser 20 and the substrate 14 provide a multi-dimensional nano structure 12. In this example, the multi-dimensional nano structure 12 is shown as a linear nano structure 12. The nano dispenser 20 may be translated using an appropriate mechanism such as a Zyvex (Richardson, Tex.) nano driver systems (x-y-z axes) for forming a two dimensional pattern on the surface 16 of the substrate 14.

FIG. 4 is a side sectional view of the laser processor 50 directing a laser beam 52 onto the nano particles 42 deposited on the surface 16 of the substrate 14. The laser processor 50 comprises a housing 54 having an input window 56 and output window 58. A concentrator 60 is located adjacent to the output window 58 of the housing 54. In this example, the concentrator 60 is shown as a waveguide 62 having an entrance aperture 64 and an exit aperture 66 with an exponential channel 68 located therebetween.

Figure 5:
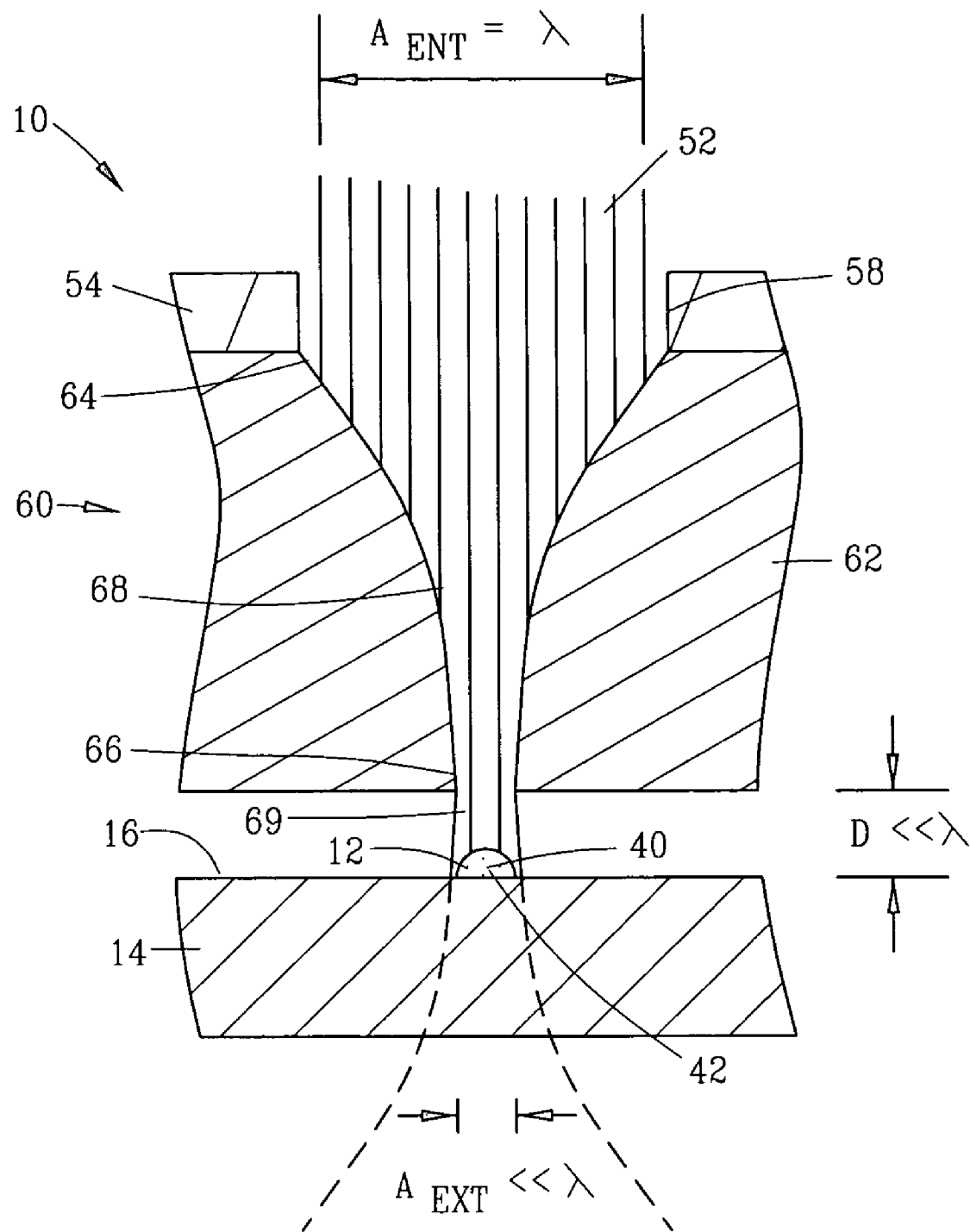
FIG. 5 is a magnified view of a portion of FIG. 4.

FIG. 5 is a magnified view of a portion of FIG. 4. Preferably, the waveguide 62 is formed from a metallic or ceramic material. The entrance aperture 64 of the exponentially shaped channel 64 has a diameter to accommodate the normal diameter of the laser beam 52. Typically, the normal diameter of the laser beam 52 is on the order of micrometers (microns) to accept a "micrometer size laser beam. The exit aperture 66 of the exponentially shaped channel 64 has a diameter on the order of nanometers to provide a nanometer size laser beam. The exponentially shaped channel 64 may be drilled into the waveguide 62 with a highly focused electron beam.

The exponentially shaped channel 68 behaves as a waveguide to propagate a reduced diameter laser beam 69 from the exit aperture 66. The reduced diameter laser beam 69 may have a diameter less than the wavelength diameter of the laser beam 52. The exit aperture 66 must be very close to the surface 16 of the substrate 14. Preferably, the exit aperture 66 must be located within one wavelength of the laser beam 52 to maintain a reduced diameter laser beam 69. If the exit aperture 66 is located more than one wavelength of the laser beam 52 from the surface 16 of the substrate 14, the reduced diameter laser beam 69 will expand to the normal diameter of the laser beam 52

The waveguide 62 provides four distinct advantages. Firstly, the entrance aperture 64 is of a sufficient diameter to accept virtually all of the energy from the laser beam 52. Secondly, the exponentially shaped channel 68 concentrates the energy from the laser beam 52 into the reduced diameter laser beam 69. Thirdly, the reduced diameter laser beam 69 enables the creation of nano structure 12 on the surface 16 of the substrate 14. Fourthly, the diameter of the reduced diameter laser beam 69 may be reduced further at the exit aperture 68 by filling the exponentially shaped channel 69 with a high refractive index liquid which decreases the wavelength of the laser beam 52 enabling the use of a smaller exit aperture 66.

The reduced diameter laser beam 69 heats the suspension fluid 40 and the nano particles 42 to fuse the nano particles 42 to form the final nano structure 12 on the surface of the substrate 14 with required electrical properties. The concentrates the energy of the reduced diameter laser beam 69 induce metallurgical changes in the nano particles 42 in order to create smooth electrically continuous patterns nano structure 12.

The irradiance can be controlled to (1)
1. drive the solvent from the fluid and fuse the remaining nano particles 42 into a continuos fused pattern. This is desired for metal conductors.
2. drive the organic from the metal-organic and fuse the remaining nano particles 42 into a continuos fused pattern. This is desired for metal conductors.
3. drive the solvent from the fluid and diffuse the remaining nano particles 42 into the substrate 14 in a continuous or discrete pattern. This is nano doping. The nano-particles are the same compositions as set forth in U.S. Pat. No. 6,670,693.
4. drive the organic from a metal-organic and diffuse the remaining nano particles 42 into the substrate 14 in a continuous or discrete pattern. This is nano doping. The nano-particles are the same compositions that we have used in the past.
5. the nano fuser can be used independently, without the nano dispenser 20 for material processing such as ablating the substrate. This is nano machining.
6. combinations of 1-3 can be used to create nano devices.

Example 1 illustrates the action of an electromagnetic wave entering a material with a positive refractive index (n). Conventional optical devices such as lenses, prisms and the like are made of positive refractive index materials (n>0), where n the refractive index. In accordance with Snell's law, an incident ray and a refracted ray lie on the opposite sides of a surface normal for a material with a positive refractive index (n>0).

When a light beam enters a converging lens such as a convex lens (not show), diffraction effect limit the minimum focused spot diameter of the converging lens. The minimum focused spot diameter is given by:

$$D_{spot} = 1.27 f \lambda / D_L$$

for a Gaussian laser beam (TEM$_{00}$ mode), where f is the focal length on the lens focusing the laser beam onto the substrate, $\lambda$ is the laser wavelength and $D_L$ is the laser beam diameter on the lens.

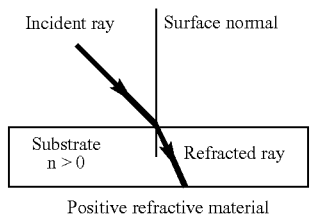

Positive refractive material

EXAMPLE 2

Example 2 illustrates the action of a light wave entering a material with a negative refractive index (n<0). The propagation of an electromagnetic wave in a medium having negative refractive index (n<0) is different compared to when the waves propagate through a medium having positive refractive index (n<0). In accordance with Snell's law, an incident ray and a refracted ray lie on the same side of a surface normal for a material with a negative refractive index (n<0).

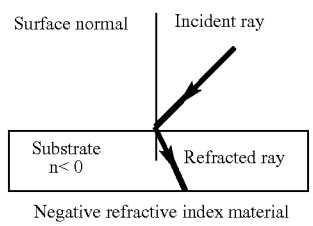

Negative refractive index material

An article by J. B. Pendry in Volume 85, Number 18 of Physical Review Letters (30 Oct. 2000) discloses the use of a lens made from a thin slab of silver having a negative refraction index.

Figure 6:
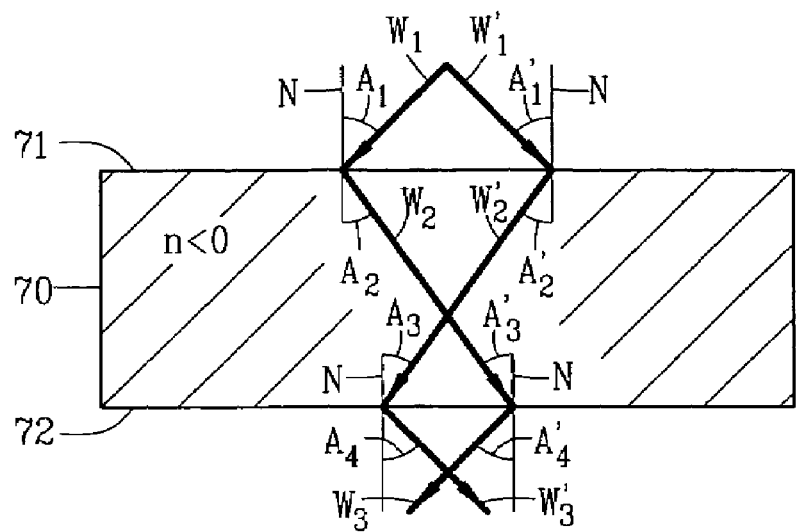
FIG. 6 is a side view of a material having a negative refractive index (n<0) for focusing an electromagnetic wave into a subwavelength focused image.

FIG. 6 is a side view of a second example of a concentrator 60A for use with the laser processor 50 of FIG. 4. In this example, the concentrator 60A comprises a rectangular prism 70 of a material having a negative refractive index (n<0). The rectangular prism 70 is defined by a first and a second parallel surface 71 and 72.

The waves $W_1$ and $W_1'$ impinge upon the first surface 71 at angles $A_1$ and $A_1'$ and are bend away from the normal N at refracted angles $A_2$ and $A_2'$ as waves $W_2$ and $W_2'$. The waves $W_2$ and $W_2'$ are bend away from the normal N due to the negative refractive index (n<0) of the material of the rectangular prism 70. The waves $W_2$ and $W_2'$ impinge upon the second surface 71 at angles $A_3$ and $A_3'$ and are bend away from the normal N at refracted angles $A_4$ and $A_4'$ as waves $W_3$ and $W_3'$. The negative refractive index (n<0) of the material of the rectangular prism 70 concentrates the concentrates the energy from the laser beam 52 into the reduced diameter laser beam 69.

Figure 7:
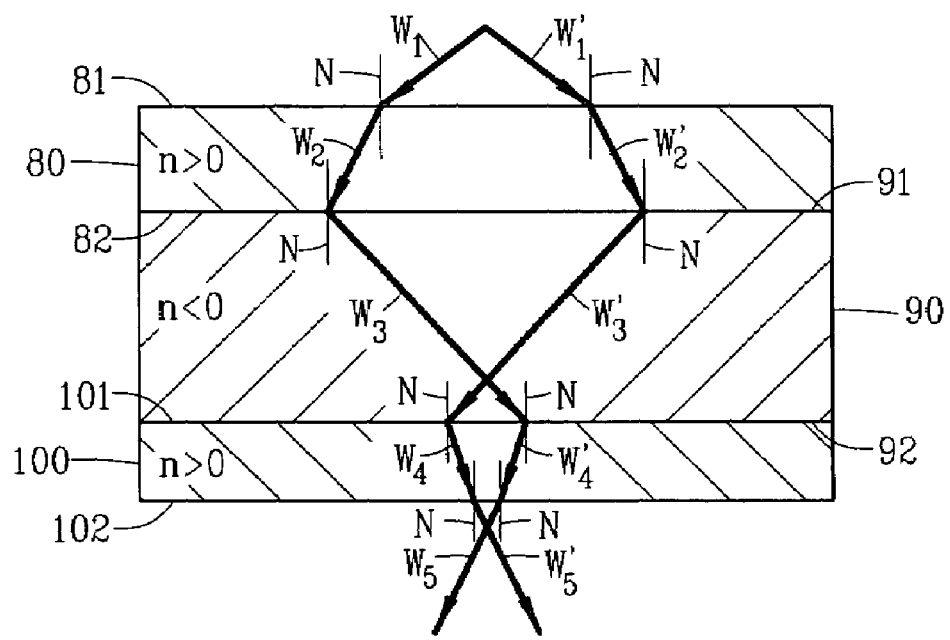
FIG. 7 is a side view of a stack of materials having a positive and negative refractive indexes for focusing an electromagnetic wave into a subwavelength focused image.

FIG. 7 is a side view of a third example of a concentrator 60B for use with the laser processor 50 of FIG. 4. In this example, the concentrator 60B comprises a stack of rectangular prisms 80, 90 and 100. The rectangular prism 80 is defined by a first and a second parallel surface 81 and 82 and has a positive refractive index (n>0). The rectangular prism 90 is defined by a first and a second parallel surface 91 and 92 and has a negative refractive index (n<0). The rectangular prism 100 is defined by a first and a second parallel surface 101 and 102 and has a positive refractive index (n>0). The parallel surfaces 82 and 91 are in intimate contact 82 as well as parallel surfaces 92 and 101 to form the stack of rectangular prisms 80, 90 and 100.

The waves $W_1$ and $W_1'$ impinge upon the first surface 81 and are bend toward the normal N due to the positive refractive index (n>0) of the material of the rectangular prism 80. The waves $W_2$ and $W_2'$ impinge upon the first surface 91 and are bend away from the normal N due to the negative refractive index (n<0) of the material of the rectangular prism 90. The waves $W_3$ and $W_3'$ impinge upon the first surface 101 and are bend away from the normal N due to the positive refractive index (n>0) of the material of the rectangular prism 100. The waves $W_4$ and $W_4'$ exit from the second surface 103 of the rectangular prism 100 in a concentrated form.

The present invention provides the ability to directly and selectively convert a semiconductor substrate 14 to the required structure of given dimensions by depositing appropriate materials eliminating photolithography steps and photolithographic materials. Nano fluidics, i.e., flow of nano particle-containing fluids through a nanopore, will allow formation of nano width patterned structures. Laser irradiation of these structures will allow the fusion of nano particles 42 leading to electrically continuous patterns on the wafer. Since the fusion temperature of nano particles 42 is significantly lower than its bulk melting temperature, near-field optics can be used to create a sub-wavelength spot size on the nano wide pattern or a short pulse laser can be used to irradiate a small amount of energy to fuse the nano particles 42. Laser processing technology combined with an understanding of photon-materials interactions has the potential to achieve these objectives.

The invention creates a new capability for direct nano patterning of wafers without requiring photolithography steps and photolithographic materials, low volume 24 patterning options and rapid prototyping for new product design, development and manufacturing. The invention can be used to dope the substrate 14 in nano scale to fabricate nano electronics devices, e.g., nano scale p-n junctions and transistors. For example, phosphorous nano particles 42 can be placed on a silicon wafer using the nano dispenser 20 and then the particles can be heated with a laser beam 31 of the nano fuser not to melt the nano particles 42 but to induce diffusion of phosphorous atoms into the silicon wafer. Besides device fabrication, this invention can be used for materials conversion and for nano machining, e.g., subwavelength drilling, scribing, marking, etc. We have carried out laser doping of silicon carbide with both n- and p-type dopants.

The invention also can be used in numerous customized applications such as laser spot linking, fabrication of application specific integrated circuits, fast turnaround and personalized multichip modules. For example, a maskless laser spot linking system can be developed to process multilayer substrate 14 that are consisted of an incomplete top layer which often contains bond pads and several lower layers containing generic, design-independent wiring patters. Another example with regard to the fluid for the nano dispenser 20 is copper formate. Copper metallized interconnecting links are formed by spin-coating the wafer using a water solution of copper formate. The solution is spun onto the wafer, dried to form a solid film, irradiated at selective areas with a frequency doubled Nd:YAG laser to decompose the film creating copper metal deposits and then the rest of the film is washed away with water. This invention will allow direct deposition of the solution and metallization at selected nanoscale locations.

Although the concentrator 60, 60A and 60B have been disclosed for use with the present invention, it should be understood that the concentrator 60, 60A and 60B may be used to concentrate a laser beam for undertaking a wide variety of applications such as materials conversion, removing materials from a substrate to create a channel, a via or a holes through the melting or vaporization of the substrate or ablation or sublimation of a portion of the substrate.

Although the invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. The process of forming a nano structure on a substrate, comprising:
    suspending nano particles in a suspension fluid;
    applying a pressure to the suspension fluid for forcing the nano particles through a nano size pore onto the substrate;
    directing a micrometer size laser beam through a concentrator for forming a nanometer size laser beam; and
    directing the nano size laser beam onto the deposited nano particles on the substrate.

2. The process of forming a nano structure on a substrate as set forth in claim 1, wherein the substrate is a semiconductor substrate.

3. The process of forming a nano structure on a substrate, comprising:
    suspending nano particles in a suspension liquid;
    applying a gas pressure to the suspension liquid for forcing the nano particles through the nano size depositing pore onto the substrate;
    directing a micrometer size laser beam through a concentrator for forming a nanometer size laser beam; and
    directing the nano size laser beam onto the deposited nano particles on the substrate.

4. The process of forming a nano structure on a substrate as set forth in claim 1, wherein the step of directing the nano size laser beam onto the deposited nano particles on the substrate changes the deposited nano particles on the substrate.

5. The process of forming a nano structure on a substrate as set forth in claim 1, wherein the step of directing the nano size laser beam onto the deposited nano particles on the substrate changes the deposited nano particles on the substrate to provide an electrically continuous nanopattern on the substrate.

6. The process of forming a nano structure on a substrate as set forth in claim 1, wherein the step of depositing nano particles includes depositing a doping material onto the substrate; and
    the step of directing the nano size laser beam onto the deposited nano particles induces diffusion of the deposited nano particles into the substrate to create a continuous doped semiconductor nanopattern in the substrate.

7. The process of forming a nano structure on a substrate as set forth in claim 1, wherein the step of directing a micrometer size laser beam through a concentrator includes directing a micrometer size laser beam through a wave guide for forming a nanometer size laser beam.

8. The process of forming a nano structure on a substrate, comprising:
    depositing nano particles through a nano size pore onto the substrate;
    directing a micrometer size laser beam through a material having a negative refractive index for forming a nanometer size laser beam; and
    directing the nano size laser beam onto the deposited nano particles on the substrate.

9. The process of processing a substrate, comprising:
    directing a micrometer size laser beam through a concentrator material having a negative refractive index for forming a nanometer size laser beam; and
    directing the nano size laser beam onto the substrate for inducing a change in the substrate.

10. The process of processing a substrate as set forth in claim 9, wherein the step of directing the nano size laser beam onto the substrate removes materials from the substrate to create voids in a portion of the substrate.

* * * * *